US012648074B2

(12) United States Patent
Sun et al.

(10) Patent No.: US 12,648,074 B2
(45) Date of Patent: Jun. 2, 2026

(54) DROPLET GENERATOR ASSEMBLY AND METHOD OF REPLACING COMPONENTS

(71) Applicant: Taiwan Semiconductor Manufacturing Co., Ltd., Hsinchu (TW)

(72) Inventors: Yu-Kuang Sun, Hsinchu (TW); Ming-Hsun Tsai, Hsinchu (TW); Wei-Shin Cheng, Hsinchu (TW); Cheng-Hao Lai, Hsinchu (TW); Hsin-Feng Chen, Hsinchu (TW); Chiao-Hua Cheng, Hsinchu (TW); Cheng-Hsuan Wu, Hsinchu (TW); Yu-Fa Lo, Hsinchu (TW); Jou-Hsuan Lu, Hsinchu (TW); Shang-Chieh Chien, Hsinchu (TW); Li-Jui Chen, Hsinchu (TW); Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/769,912

(22) Filed: Jul. 11, 2024

(65) Prior Publication Data
US 2024/0365461 A1 Oct. 31, 2024

Related U.S. Application Data

(62) Division of application No. 17/483,298, filed on Sep. 23, 2021, now Pat. No. 12,063,734.
(Continued)

(51) Int. Cl.
*H05G 2/00* (2006.01)
*G03F 7/00* (2006.01)
*G05D 23/19* (2006.01)

(52) U.S. Cl.
CPC ....... *H05G 2/0027* (2024.08); *G03F 7/70033* (2013.01); *H05G 2/002* (2024.08); *G05D 23/19* (2013.01); *H05G 2/0035* (2024.08)

(58) Field of Classification Search
CPC ........ H05G 2/006; H05G 2/005; H05G 2/008; G03F 7/70033; G03F 7/70975; G05D 23/19
See application file for complete search history.

(56) References Cited

U.S. PATENT DOCUMENTS 4,809,727 A    3/1989  Chamberlin
5,890,652 A    4/1999  Taylor
            (Continued)

*Primary Examiner* — Patrick C Williams
(74) *Attorney, Agent, or Firm* — Seed IP Law Group

(57) ABSTRACT

The present disclosure is directed to a modularized vessel droplet generator assembly (MGDVA) including a droplet generator assembly (DGA). Under a normal operation, the liquid fuel moves along an operation pathway extending through the DGA to eject or discharge the liquid fuel (e.g., liquid tin) from a nozzle of the DGA into a vacuum chamber. The liquid fuel in the vacuum chamber is then exposed to a laser generating an extreme ultra-violet (EUV) light. Under a service operation, the operation pathway is closed and a service pathway extending through the DGA is opened. A gas is introduced into the service pathway forming a gas-liquid interface between the gas and the liquid fuel. The gas-liquid interface is driven to an isolation valve directly adjacent to the DGA. In other words, the gas pushes back the liquid fuel to the isolation valve. Once the gas-liquid interface reaches the isolation valve, the isolation valve is closed isolating the DGA from the liquid fuel.

20 Claims, 7 Drawing Sheets

Related U.S. Application Data

(60) Provisional application No. 63/175,999, filed on Apr. 16, 2021.

(56) References Cited

U.S. PATENT DOCUMENTS

| | | | |
|---|---|---|---|
| 6,507,641 | B1 | 1/2003 | Kondo et al. |
| 8,689,571 | B2 | 4/2014 | Lafaire et al. |
| 2006/0192155 | A1 | 8/2006 | Algots et al. |
| 2010/0213272 | A1 | 8/2010 | Yabu et al. |
| 2015/0345659 | A1 | 12/2015 | Yamamoto et al. |
| 2019/0137882 | A1 | 5/2019 | Lai et al. |
| 2022/0159817 | A1* | 5/2022 | Govindaraju ....... G03F 7/70033 |

* cited by examiner

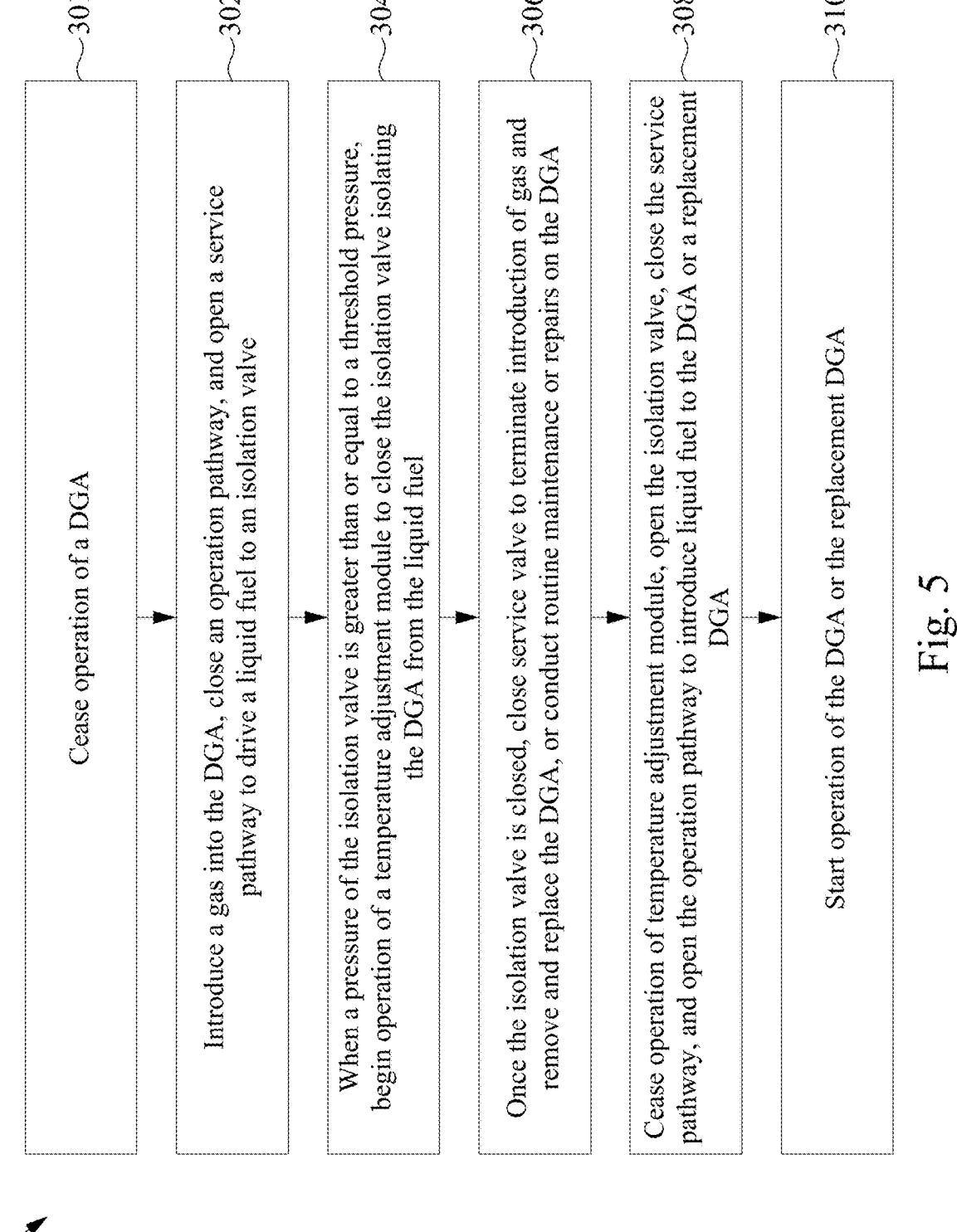

300

301 — Cease operation of a DGA

302 — Introduce a gas into the DGA, close an operation pathway, and open a service pathway to drive a liquid fuel to an isolation valve 304 — When a pressure of the isolation valve is greater than or equal to a threshold pressure, begin operation of a temperature adjustment module to close the isolation valve isolating the DGA from the liquid fuel 306 — Once the isolation valve is closed, close service valve to terminate introduction of gas and remove and replace the DGA, or conduct routine maintenance or repairs on the DGA 308 — Cease operation of temperature adjustment module, open the isolation valve, close the service pathway, and open the operation pathway to introduce liquid fuel to the DGA or a replacement DGA 310 — Start operation of the DGA or the replacement DGA

Fig. 5

DROPLET GENERATOR ASSEMBLY AND METHOD OF REPLACING COMPONENTS

PRIORITY CLAIM AND CROSS REFERENCE

This application is a divisional of U.S. patent application Ser. No. 17/483,298, filed on Sep. 23, 2021, and claims priority to U.S. Provisional Application 63/175,999, which are hereby incorporated by reference in its entirety.

BACKGROUND

Technical Field

The present disclosure is directed to a modularized vessel droplet generator assembly (MVDGA) and a method of replacing components of the MVDGA.

Description of the Related Art

Extreme ultraviolet light, e.g., electromagnetic radiation having wavelengths of around 50 nanometers (nm) or less (also sometimes referred to as soft x-rays), and including light at a wavelength of about 13.5 nm, can be used in photolithography processes to produce extremely small features in substrates such as silicon wafers. Here and elsewhere herein the term light will be used even though it is understood that the radiation described using that term may not be in the visible part of the spectrum.

Methods for generating extreme ultra-violet (EUV) light include converting a target material from a liquid state into a plasma state. The target material preferably includes at least one element, e.g., xenon, lithium or tin, with one or more emission lines in the EUV range. In one such method, often termed laser produced plasma ("LPP"), the required plasma can be produced by using a laser beam to irradiate a target material having the required line-emitting element.

BRIEF SUMMARY

The present disclosure is directed to at least one embodiment of a modularized vessel droplet generator assembly (MVDGA) configured to generate an extreme ultra-violet (EUV) light. The MVDGA includes a droplet generator assembly configured to a provide a fuel used to generate the EUV light. When the fuel is a liquid, the liquid fuel is ejected or discharged from a nozzle of the DGA as a stream of discrete droplets or as a continuous stream. A service valve and an isolation valve are coupled to the droplet generator assembly such that the isolation valve and the service valve are in fluid communication with each other along a service pathway. A DGA isolation valve (DIV) system or assembly is coupled to the droplet generator assembly. The DIV system includes the isolation valve coupled to the droplet generator assembly. The DIV system further includes a pressure sensor coupled to the isolation valve and a temperature adjustment module coupled to the pressure sensor. The pressure sensor monitors and detects a pressure of (e.g., at, within, around, adjacent to the isolation valve, etc.) the isolation valve, and, when the pressure is substantially equal to or greater than a threshold pressure, a controller causes the temperature adjustment module to be turned on to decrease the temperature of the isolation valve.

In at least one embodiment, a method of replacing a first droplet generator includes ceasing (e.g., stopping) operation of the first droplet generator of an EUV lithography system. Once the operation of the first droplet generator is ceased, the first droplet generator stops discharging a fuel, which is in liquid form. In accordance with an embodiment, the liquid fuel is communicated from a liquid fuel supply to the first droplet generator through a fuel transfer assembly.

After the droplet generator is turned off, the liquid fuel is isolated from the first droplet generator by introducing a gas at a first pressure from a gas supply through a service valve in fluid communication with the first droplet generator. Introducing the gas into the service valve forms a gas-liquid interface between the gas and the liquid fuel in the first droplet generator. The gas-liquid interface is then driven to an isolation valve in fluid communication with the first droplet generator and the service valve along a service pathway. A pressure at (e.g., within, around, adjacent to the isolation valve, etc.) the isolation valve is monitored by a pressure sensor coupled to the isolation valve, and once the pressure of (e.g., at, within, around, adjacent to the isolation valve, etc.) the isolation valve is substantially equal to or greater than a threshold pressure the isolation valve is closed. The isolation valve may be closed by solidifying the liquid fuel within the isolation valve, e.g., by beginning operation (e.g., turn on or starting) of a temperature adjustment module which decreases a temperature of the isolation valve causing the liquid fuel within the isolation valve to solidify. After the isolation valve is closed and the first droplet generator is at a temperature low enough to be handled, the first droplet generator is decoupled and removed from the MVDGA. After the first droplet generator is decoupled and removed from the MVDGA, a second droplet generator is coupled to the MVDGA replacing the first droplet generator. Once the second droplet generator is in place, the liquid fuel is introduced to the second droplet generator by opening the isolation valve. The isolation valve is opened by warming the isolation valve which causes solidified fuel to liquefy within the isolation valve. Once the liquid fuel is introduced to the second droplet generator, the second droplet generator is started back up such that the second droplet generator begins discharging or ejecting the liquid fuel as either a stream of discrete droplets or a continuous stream.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

FIG. 5 is directed to a flowchart of the method of replacement utilizing the embodiment of the DIV system of the present disclosure to replace the first droplet generator of the MVDGA with the second droplet generator as shown in FIGS. 4A-4C.

DETAILED DESCRIPTION

Figure 1:
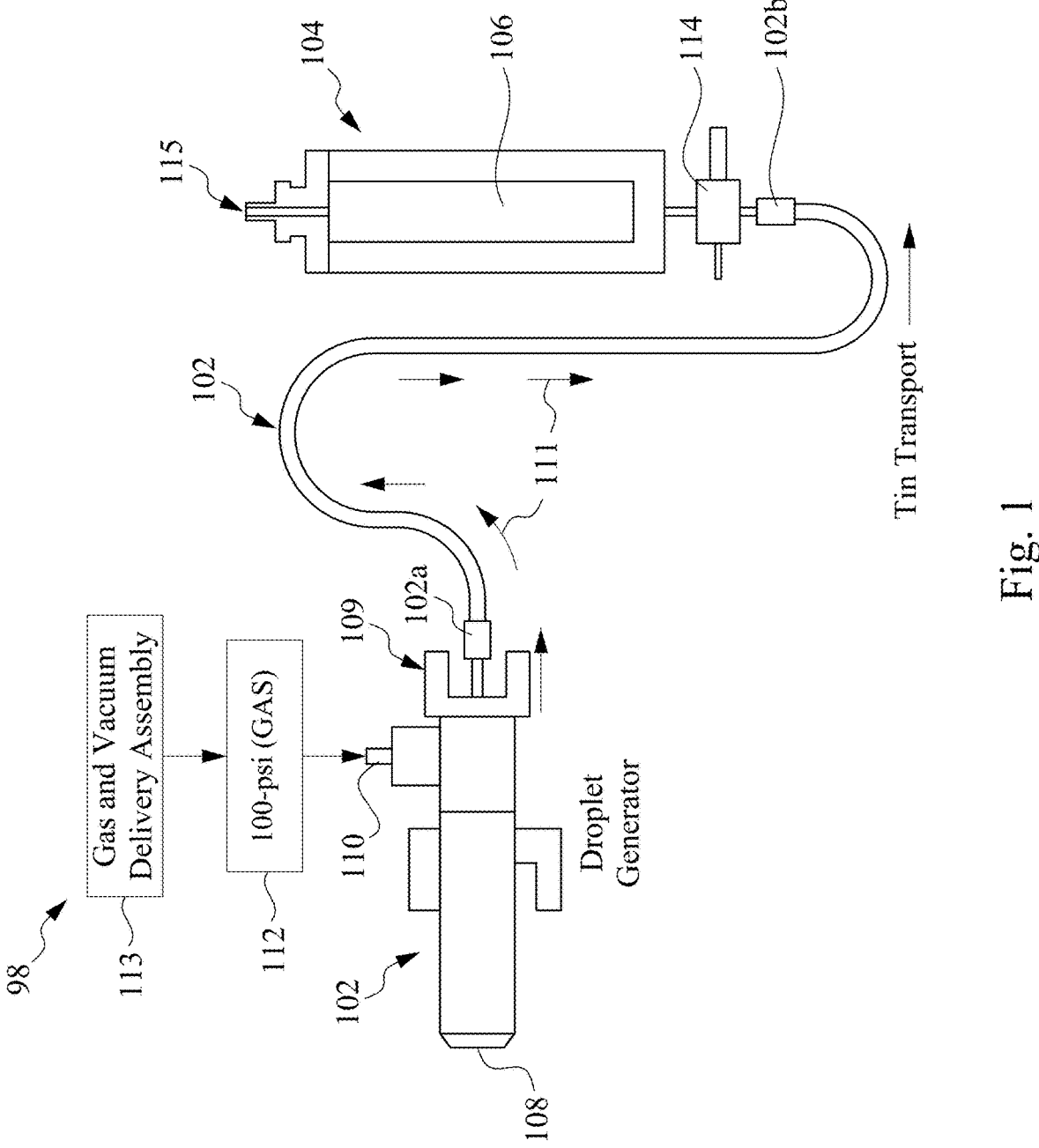
FIG. 1 is directed to a droplet generator assembly (DGA) coupled to a liquid fuel storage or supply assembly.

In the following description, certain specific details are set forth in order to provide a thorough understanding of various embodiments of the disclosure. However, one skilled in the art will understand that the disclosure may be practiced without these specific details. In other instances, well-known structures associated with extreme ultra-violet (EUV) lithography systems or semiconductor manufacturing process have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences and variation when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

While one embodiment is shown and described with respect to toilets, it will be readily appreciated that embodiment of the present disclosure is not limited thereto. In various embodiments, the structures, devices, methods and the like described herein may be embodied in or otherwise utilized in any suitable EUV lithography systems or semiconductor manufacturing process.

Generally, extreme ultraviolet light, e.g., electromagnetic radiation having wavelengths of around 50 nanometers (nm) or less (also sometimes referred to as soft x-rays), and including light at a wavelength of about 13.5 nm, can be used in photolithography processes to produce extremely small features in substrates such as silicon wafers. Here and elsewhere herein the term light will be used even though it is understood that the radiation described using that term may not be in the visible part of the spectrum.

Related methods for generating extreme ultra-violet (EUV) light include converting a target material from a liquid state into a plasma state. The target material preferably includes at least one element, e.g., xenon, lithium or tin, with one or more emission lines in the EUV range. In one such method, often termed laser produced plasma ("LPP"), the required plasma can be produced by using a laser beam to irradiate a target material having the required line-emitting element.

The target material may take many forms. It may be solid or molten. If molten, it may be dispensed in several different ways such as in a continuous stream or as a stream of discrete droplets. As an example, the target material in much of the discussion which follows is molten tin which is dispensed as a stream of discrete droplets. It will be understood by one of ordinary skill in the art, however, that other forms of material and delivery modes may be used.

The stream of droplets is generated by a droplet generator. The portion of the droplet generator that releases the droplets, sometimes referred to as the nozzle or the nozzle assembly, is located within the vacuum chamber. Considering the example of molten tin dispensed as a stream of discrete droplets, technical challenges arise in supplying target material to the droplet generator and in the recovery of the target material that is not vaporized. This is due in part to the fact that in operation the droplet generator must be maintained at a temperature above the melting point of the target material. It is also due to the fact that the interior of the droplet generator is maintained at pressure to expel the molten target material from the nozzle.

In general, it is possible to supply target material to the droplet generator by depressurizing and cooling the droplet generator, opening the droplet generator, loading solid target material into the droplet generator, closing the droplet generator, and repressurizing and heating the droplet generator. It can be appreciated that this method of supplying tin to the droplet generator can be quite time consuming and labor intensive. It also involves taking the droplet generator offline, resulting in significant downtime. This is especially troublesome when the design of the droplet generator is such that it must be reloaded frequently.

Also, it may be difficult to restart the droplet generator when the droplet generator is stopped and cooled down below the melting point of the target material. This is at least partly because the nozzle may have a very small orifice. Permitting the temperature of the nozzle to fall below the melting temperature of the target material may cause the target material in the nozzle to solidify. This may in turn cause or permit the formation of contaminant particles to form. These particles may precipitate out of the target material when the nozzle is reheated to re-melt the target material. Some particles may also be dislodged from surfaces upstream of the nozzle due to the effect of thermal contraction and expansion and associated mechanical stresses or by surface tension forces when the droplet generator is emptied. The particles can clog the nozzle thus making it difficult or impossible for the droplet generator to restart. Similarly, when the droplet generator runs out of target material, cooling the nozzle of the droplet generator can have a severe negative effect on nozzle integrity and can also make it difficult or impossible for droplet generator to restart.

Thus, cooling the entire droplet generator down to a temperature at which it can be handled safely and replenishing the target material may not always be a feasible method of reloading the droplet generator. Also, near an end of a useful life span of the droplet generator or to maintain (e.g., repair, fix, or conduct routine maintenance) the droplet generator, the droplet generator is shut down to be replaced by a new droplet generator, repaired, or maintained. During the shut down, the droplet generator is cooled down to a temperature at which the droplet generator can be handled safely before replacement, repair, or maintenance. However, shutting down the droplet generator every time the droplet generator is to be replaced, repaired, or maintained results in significant downtime for the EUV light generation system and also limits the useful life span of the droplet generator.

The present disclosure describes embodiments of methods of replacing a first droplet generator assembly (DGA) of a modularized vessel droplet generator assembly (MVDGA), which is part of an extreme ultra-violet (EUV) lithography system, with a replacement DGA by utilizing an isolation valve directly adjacent to the first DGA in the MVDGA. The EUV lithography system including the MVDGA may be utilized to produce extremely small features in substrates such as silicon wafers. Utilizing the isolation valve to replace the first DGA with a replacement DGA significantly reduces downtime of the EUV lithography system by reducing a period of time to replace the first DGA with the replacement DGA as compared to other methods of replacing the first DGA, which will become readily apparent in the following discussion within the present disclosure.

For example, in at least one embodiment, a method of replacing the DGA includes stopping the DGA from ejecting or discharging a fuel, which is in a liquid phase, and introducing a gas into the DGA through a service valve. Introducing the gas forms a gas-liquid interface between the gas and the liquid fuel. The gas-liquid interface is at a location where the gas and the liquid fuel abut each other. The gas-liquid interface is then driven towards an isolation valve, which may be at an inlet of the DGA, where the liquid fuel exits the DGA such that the liquid fuel passes into and through the isolation valve. A pressure sensor monitors a pressure of the isolation valve (e.g., at, within, around, adjacent to the isolation valve, etc.), and, once the pressure in the isolation valve is substantially equal to or greater than a selected threshold pressure, the temperature of the isolation valve is decreased, e.g., using a temperature adjustment module which is operated to decrease the temperature of the isolation valve. The decrease in the temperature of the isolation valve solidifies the liquid fuel in the isolation valve effectively closing the isolation valve by plugging the isolation valve with a solidified fuel portion. Closing the isolation valve isolates the liquid fuel from the DGA. After the isolation valve is closed by the solidified fuel portion, the first DGA is removed from the MVDGA and the replacement DGA is coupled to the MVDGA. After the replacement DGA has been coupled to the MVDGA of the EUV lithography system, the temperature of the isolation valve is increased, and, as the temperature of the isolation valve increases, the solidified fuel portion isolating the liquid fuel from the DGA liquefies, thereby unplugging and opening the isolation valve. Liquefying the solidified fuel portion allows the liquid fuel to pass through the isolation valve and be introduced to the replacement DGA such that operation of the replacement DGA may begin. In some embodiments, the same temperature adjustment module used to cool the isolation valve can be used to increase the temperature of the isolation valve.

In the above embodiment of the method of replacement of the present disclosure, the liquid fuel is driven back to the isolation valve, which is directly adjacent to the first DGA and located closer to the DGA than other components of the fuel delivery system, including the liquid fuel supply storage tanks. Driving the liquid fuel back to the isolation valve takes much less time as compared to driving the liquid fuel back to other components of a fuel delivery system of an EUV system which are located farther from the DGA than the isolation valve. For example, in accordance with embodiments of the present disclosure, a DGA can be isolated from the fuel supply in a matter of minutes as opposed to hours. For example, in some embodiments a DGA can be isolated from the fuel supply in 30 minutes or less. This is significantly less than the 4 to 5 hours is required to isolate a DGA using related techniques. This reduction in time utilizing the methods of replacing a DGA in accordance with embodiments of the present disclosure significantly reduces downtime of the DGA when conducting routine maintenance on the DGA, or repairing the DGA.

In at least one embodiment of the present disclosure, the MVDGA of the present disclosure includes a droplet generator assembly configured to discharge or eject a stream of discrete droplets or a continuous stream of a fuel, which is in liquid phase (e.g., a liquid fuel). A service valve is coupled to the droplet generator assembly and is in fluid communication with a gas and vacuum delivery system to introduce a gas to a service pathway extending through the DGA of the MVDGA.

A droplet generator assembly isolation valve (DIV) system is coupled to the DGA. The DIV system includes an isolation valve coupled to the DGA, which is in fluid communication with the service valve, a pressure sensor coupled to the isolation valve, and a temperature adjustment module coupled to the pressure sensor configured to decrease or increase a temperature of the isolation valve when operated (e.g., turned on). The pressure sensor is configured to monitor and detect a pressure of (e.g., at, within, around, adjacent to the isolation valve, etc.) the isolation valve, and, when the pressure is substantially equal to or greater than a selected threshold pressure, the temperature adjustment module is controlled, e.g., by a controller, to decrease the temperature of the isolation valve. The pressure of the isolation valve may be a pressure within the isolation valve, near or at a first end of the isolation valve closer to the DGA, near or at a second end of the isolation valve further away from the DGA relative to the first end, around the isolation valve, or adjacent to the isolation valve. This decrease in temperature of the isolation valve causes a phase change of the liquid fuel in the isolation valve from a liquid phase to a solid phase closing the isolation valve by forming a solidified fuel portion within the isolation valve. In other words, the solidified fuel portion plugs the isolation valve to close off the isolation valve. The closing of the isolation valve isolates the liquid fuel from the DGA such that the DGA may be replaced with a replacement DGA, repaired, or maintained (e.g., conduct routine maintenance).

FIG. 1 is directed to a modularized vessel droplet generator assembly (MVDGA) 98 including a droplet generator assembly (DGA) 100 coupled to a first end 102a of a liquid fuel transfer assembly 102. A second end 102b of the liquid fuel transfer assembly 102 is coupled to a fuel storage or supply 104, which contains a liquid fuel 106. The liquid fuel transfer assembly 102 may include a pipe. The liquid fuel 106 may be a tin material having a freezing point substantially equal to 449.5 degrees Fahrenheit (° F.).

Under a normal operation mode, the DGA 100 discharges or ejects the liquid fuel 106 from a nozzle 108 transferred or communicated from the fuel supply to the DGA 100 through the liquid fuel transfer assembly 102 to a reception end 109 of the DGA 100. The nozzle 108 is in fluid communication with the reception end and the reception end is coupled to and in fluid communication with the first end 102a of the liquid fuel transfer assembly 102. The nozzle 108 may eject or discharge the liquid fuel 106 into a vacuum chamber as a stream of discrete droplets or a continuous stream that is then exposed to a laser to generate extreme ultra-violet (EUV) light while performing or conducting a lithography process. The nozzle 108 may include one or more electro-actuatable elements, e.g., actuators made of a piezoelectric material, which can be selectively expanded or contracted to deform a capillary tube in fluid communication with the nozzle 108 and modulate the liquid fuel 106 discharged or ejected from the nozzle 108.

Figure 2:
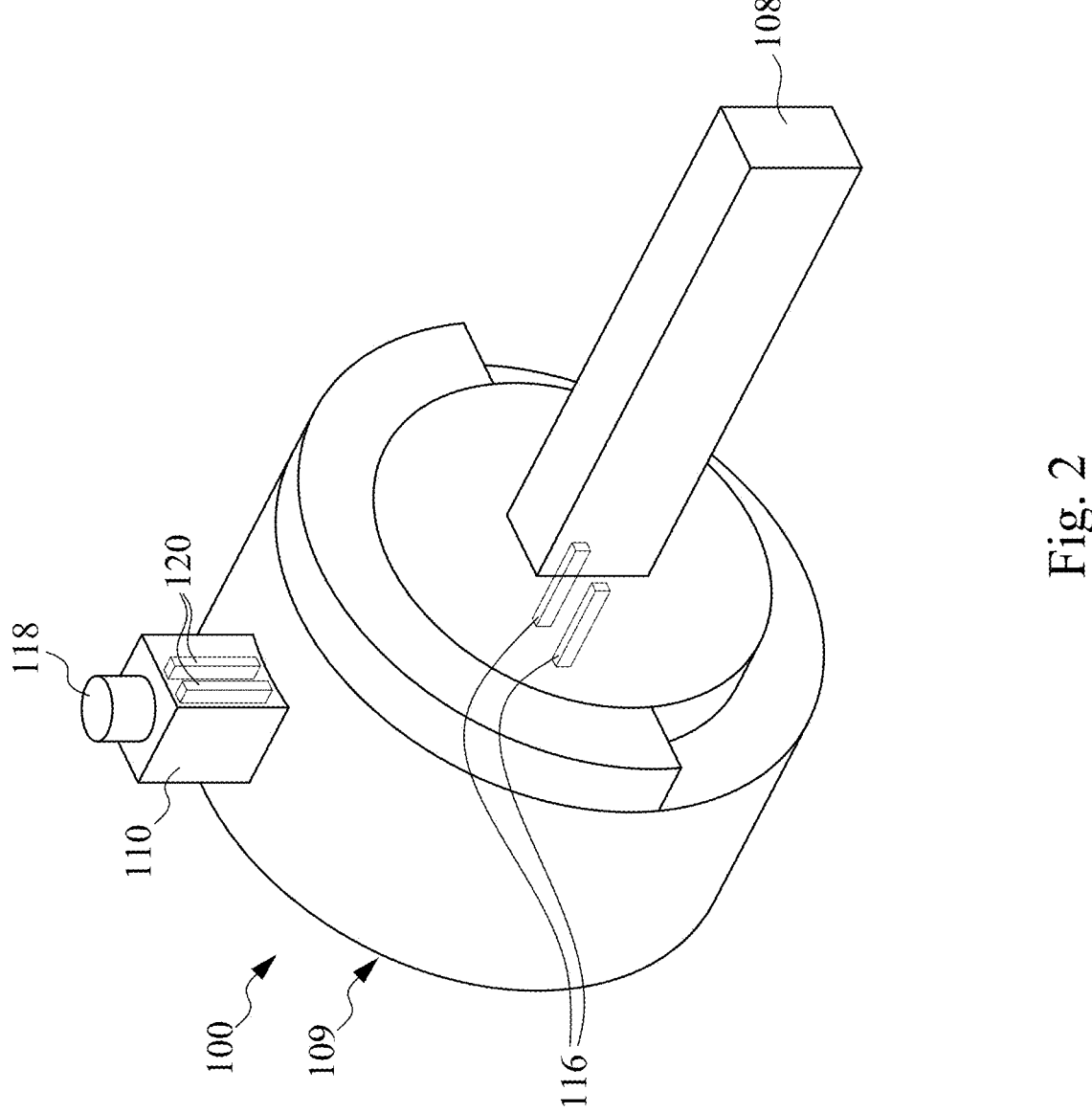
FIG. 2 is directed to the DGA as shown in FIG. 1.

Under a service operation mode, the DGA 100 is turned off such that the DGA 100 no longer ejects or discharges the liquid fuel 106 as discussed above with respect to the normal operation of the DGA 100. After the DGA 100 is turned off or operation of the DGA 100 has been ceased (e.g., stopped), a service valve 110 is opened to introduce a gas 112 from a gas and vacuum delivery assembly 113, which is in fluid communication with the service valve 110, to a service pathway 120 as shown in FIG. 2. Either at substantially the same time or before the gas 112 is introduced into the service pathway 120 through the service valve 110, an operation pathway 116, as shown in FIG. 2, is closed such that the gas 112 and liquid fuel 106 do not travel along the operation pathway 116. The service valve 110 is in fluid communication with the DGA 100 along the service pathway 120 that is in fluid communication with the liquid fuel transfer assembly 102. The gas 112 is pressurized and is introduced into the DGA 100 through the service valve 110. For example, the gas 112 may be introduced at a 100 pounds per square inch (psi). The gas 112 forms a gas-liquid interface (e.g., a location at which the gas 112 and the liquid fuel 106 abut each other to drive back the liquid fuel 106 utilizing the gas 112) with the liquid fuel 106 in the DGA 100 and the gas 112 drives the gas-liquid interface from the DGA 100 through the liquid fuel transfer assembly 102 to the fuel supply 104. For the sake of simplicity and brevity of the present disclosure, the functionality of the service valve 110 will become readily apparent in view of the further discussion with respect to a service valve 236 as shown in FIG. 4B.

The gas 112 is continuously introduced into the DGA 100 until the liquid fuel 106 previously present within the DGA 100 and the liquid fuel transfer assembly 102 is driven entirely back to the fuel supply 104 as indicated by arrows 111 as shown in FIG. 1. Once the liquid fuel 106 is driven back such that none of the liquid fuel 106 is present within the DGA 100 or the liquid fuel transfer assembly 102, the fuel supply 104 may be closed by closing a fuel valve 114 coupled between the second end 102b of the liquid fuel transfer assembly 102 and the fuel supply 104. After the fuel valve 114 is closed, the service valve 110 may be closed terminating the introduction of the gas 112 into the DGA 100. Any excess of the gas 112 that entered the fuel supply 104 when the gas 112 is being introduced into the DGA 100 through the service valve 110 may be removed from the fuel supply 104 through a release valve 115. The DGA 100 is then removed from the first end 102a of the liquid fuel transfer assembly 102, and a replacement DGA (not shown), which is the same or similar to the DGA 100 previously coupled to the liquid fuel transfer assembly 102, is coupled to the first end 102a of the liquid fuel transfer assembly 102.

After the replacement DGA 100 is coupled to the liquid fuel transfer assembly 102, the fuel valve 114 is opened and the liquid fuel 106 travels through the fuel valve 114 to the liquid fuel transfer assembly 102. The liquid fuel 106 enters the second end 102b of the liquid fuel transfer assembly 102 and travels along the liquid fuel transfer assembly 102 to the first end 102a. Once the liquid fuel 106 reaches the first end 102a, the liquid fuel 106 enters the replacement DGA 100 supplying the DGA 100 with the liquid fuel 106 such that the DGA 100 may eject or discharge the liquid fuel 106 during the normal operation of the DGA 100. Once the liquid fuel 106 reaches the replacement DGA 100, the replacement DGA 100 is turned on to perform the normal operation as discussed earlier.

The method of replacement as discussed above with respect to replacing the DGA 100 as shown in FIG. 1 with a replacement DGA can take about substantially 4 hours to 5 hours to complete replacement. During this substantially 4-hour to 5-hour period of time, the MVDGA 98 and the EUV lithography system that includes the MVDGA 98 cannot operate to perform a lithography process as the EUV lithography system cannot generate EUV light.

FIG. 2 is directed to the DGA 100 as shown in FIG. 1. In the embodiment as shown in FIG. 2, the DGA 100 includes the nozzle 108 and the service valve 110. The nozzle 108 is at the right-hand side of FIG. 2 and is in fluid communication with the reception end of the DGA 100. At least one operation pathway 116 extends from the reception end to the nozzle 108 and is in fluid communication with the nozzle 108. The liquid fuel 106 moves through the operation pathway 116 when the DGA 100 is under the normal operation such that the liquid fuel 106 is ejected or discharged through the nozzle 108. Alternatively, when the DGA 100 is under the service operation, the operation pathway 116 is closed such that the liquid fuel 106 does not travel along or pass through the operation pathway 116 to the nozzle 108. While not shown, the operation pathway 116 may extend from the reception end to the nozzle 108 such that the liquid fuel 106 successively travels through the reception end and then through the operation pathway 116 to reach and be ejected or discharged from the nozzle 108.

The service valve 110 of the DGA 100 is at a top end of the DGA 100 based on the orientation of the DGA 100 as shown in FIG. 2. The service valve 110 includes a gas orifice 118 in fluid communication with the gas and vacuum delivery assembly 113, which is shown in FIG. 1. The gas orifice 118 of the service valve 110 is in fluid communication with at least one service pathway 120 in fluid communication with the reception end of the DGA 100. The gas 112 from the gas and vacuum delivery assembly 113 moves through the service pathway 120 when the DGA 100 is under the service operation such that the liquid fuel 106 is driven out of the DGA 100 through the reception end. Alternatively, when the DGA 100 is under the normal operation, the service pathway 120 is closed such that the gas 112 does not travel along the service pathway 120 and the liquid fuel 106 does not travel along the service pathway 120. While not shown, the service pathway 120 may extend from the gas orifice 118 of the service valve 110 to the reception end, such that the gas 112 successively travels through the gas orifice 118 of the service valve 110 and then through the service pathway 120 to drive the liquid fuel 106 through the reception end and towards the liquid fuel transfer assembly 102 and the fuel supply 104.

In some embodiments, the service pathway 120 and the operation pathway 116 may be in fluid communication with each other. In some embodiments, the service pathway 120 and the operation pathway 116 may partially overlap each other. However, as discussed earlier, when the DGA 100 is under the normal operation, the service pathway 120 is closed and the liquid fuel 106 does not pass through the service pathway 120, and, instead, the liquid fuel 106 is directed along the operation pathway 116. Alternatively, as discussed earlier, when the DGA 100 is under the service operation, the operation pathway 116 is closed and the liquid fuel 106 and the gas 112 do not pass through the operation pathway 116, and, instead, the gas 112 and the liquid fuel 106 are directed along the service pathway 120.

Figure 3:
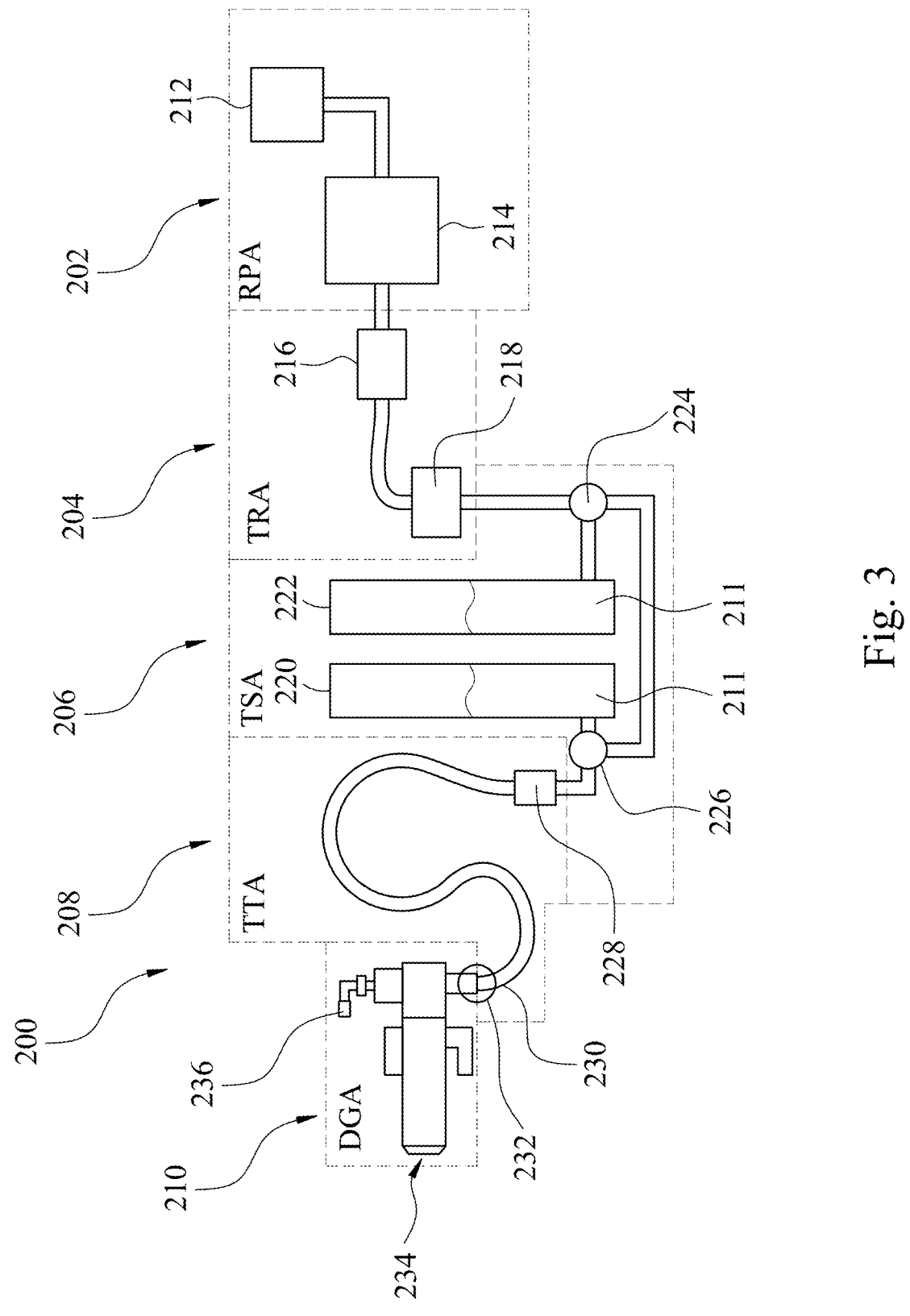
FIG. 3 is directed to an embodiment of a droplet generator assembly (DGA) of the present disclosure having a DGA coupled to an embodiment of a DGA isolating valve (DIV) system of the present disclosure.

FIG. 3 is directed to an embodiment of a MVDGA 200 of the present disclosure that is useful in an EUV lithography system. The MGDVA includes a refill and priming assembly (RPA) 202, a liquid (e.g., molten tin) refill assembly (TRA) 204, a liquid fuel (e.g., molten tin) storage or supply assembly (TSA) 206, a liquid fuel (e.g., molten tin) transfer assembly (TTA) 208, and a droplet generator assembly (DGA) 210. When the DGA 210 is discharging or ejecting a liquid fuel 211, the liquid fuel 211 moves through the various components of the MVDGA 200 in a direction along the MVDGA 200 from the TRA 204 to the DGA 210. The liquid fuel 211 is the same or similar to the liquid fuel 106 as discussed earlier in the present disclosure with respect to FIGS. 1 and 2.

The RPA 202 is coupled to and in fluid communication with the TRA 204. The RPA 202 is configured to be utilized to convert a solidified fuel into a liquid phase to introduce additional amounts of the liquid fuel 211 into the MVDGA 200. For example, a solidified fuel (e.g., solid tin) is placed within a heating element or component (e.g., heating container) 212 that heats up the solidified fuel causing a phase change from the solidified fuel to the liquid fuel 211. The liquid fuel 211 then moves along the RPA 202 to a filter 214 that filters the liquid fuel 211 to remove contaminants present within the liquid fuel 211 that may still be solid phase. After the liquid fuel 211 is filtered by passing through the filter 214, the liquid fuel 211 enters a first end 216 of the TRA 204 and passes through the TRA 204 to a second end 218 of the TRA 204. The liquid fuel 211 then enters the TSA 206. The TRA 204 may be a pipe.

After the liquid fuel 211 passes through the second end 218 of the TRA 204, the liquid fuel 211 enters the TSA 206. The liquid fuel 211 is stored in at least one liquid fuel container or vessel of the TSA 206. In this embodiment, the TSA 206 includes a first liquid fuel container 220 and a second liquid fuel container 222. The liquid fuel 211 is stored in the first and second containers 220, 222, and the first and second containers 220, 222 may be opened and closed in a controlled manner to limit an amount of liquid fuel 211 provided to the TTA 208. For example, the amount of liquid fuel 211 introduced into the TTA 208 may be controlled by controlling opening and closing of a plurality of valves 224, 226 in fluid communication with the first and second liquid fuel containers 220, 222, respectively. In this embodiment, the plurality of valves 224, 226 includes a first valve 224 in fluid communication between the TSA 206 and the TRA 204 and a second valve 226 in fluid communication between the TSA 206 and the TTA 208. The TTA 208 may be a pipe.

Limiting the amount of the liquid fuel 211 provided to the TTA 208 limits and controls the amount of the liquid fuel 211 introduced to the DGA 210 to avoid damaging the DGA 210. For example, if too much of the liquid fuel 211 is introduced to the DGA 210, the DGA 210 may not be able to eject or discharge the liquid fuel 211 with enough rapidness to avoid the liquid fuel 211 from overflowing from the DGA 210 or from a large pressure building up within the DGA 210. The overflowing of the DGA 210 or the large build of pressure within the DGA 210 may cause undue stress and strain to components with the DGA 210, which may reduce the useful life span of the DGA 210 or result in failure of the DGA 210 due to components breaking or failing (e.g., breaking, cracking, shearing).

When the liquid fuel 211 is introduced to the TTA 208, the liquid fuel 211 enters a first end 228 of the TTA 208 and passes through the TTA 208 to exit at a second end 230 of the TTA 208 such that the liquid fuel 211 is introduced to the DGA 210 through a DGA isolation valve (DIV) system 232. Under a normal operation (which is similar to the normal operation as discussed earlier with respect to FIG. 1), when the liquid fuel 211 enters the DGA 210 through the DIV system 232, the liquid fuel 211 moves through the DGA 210 to a nozzle 234 (which is the same or similar to the nozzle 108 of the DGA 100 as discussed earlier with respect to FIG. 1). The liquid fuel 211 is then ejected or discharged from the DGA 210 through the nozzle 234 in the form of stream of discrete droplets of the liquid fuel 211 or a continuous stream of the liquid fuel 211. The liquid fuel 211 may be ejected or discharged from the DGA 210 into a vacuum chamber, and, when in the vacuum chamber, the liquid fuel 211 is exposed to a laser generating EUV light.

A service valve 236 is in fluid communication with the DGA 210. The service valve 236 as shown in FIG. 3 is the same or similar to the service valve 110 in the DGA 100 as shown in FIG. 1. The details of the service valve 236 under a service operation of the DGA 210 as shown in FIG. 2 will be discussed in further detail with respect to FIGS. 4A-4C as follows within the present disclosure. The functionality of both the service valve 110 of the DGA 100 and the service valve 236 of the DGA 210 will be readily apparent in view of the discussion of the functionality of the service valve 236 with respect to FIG. 4B later on within the present disclosure.

Figure 4A:
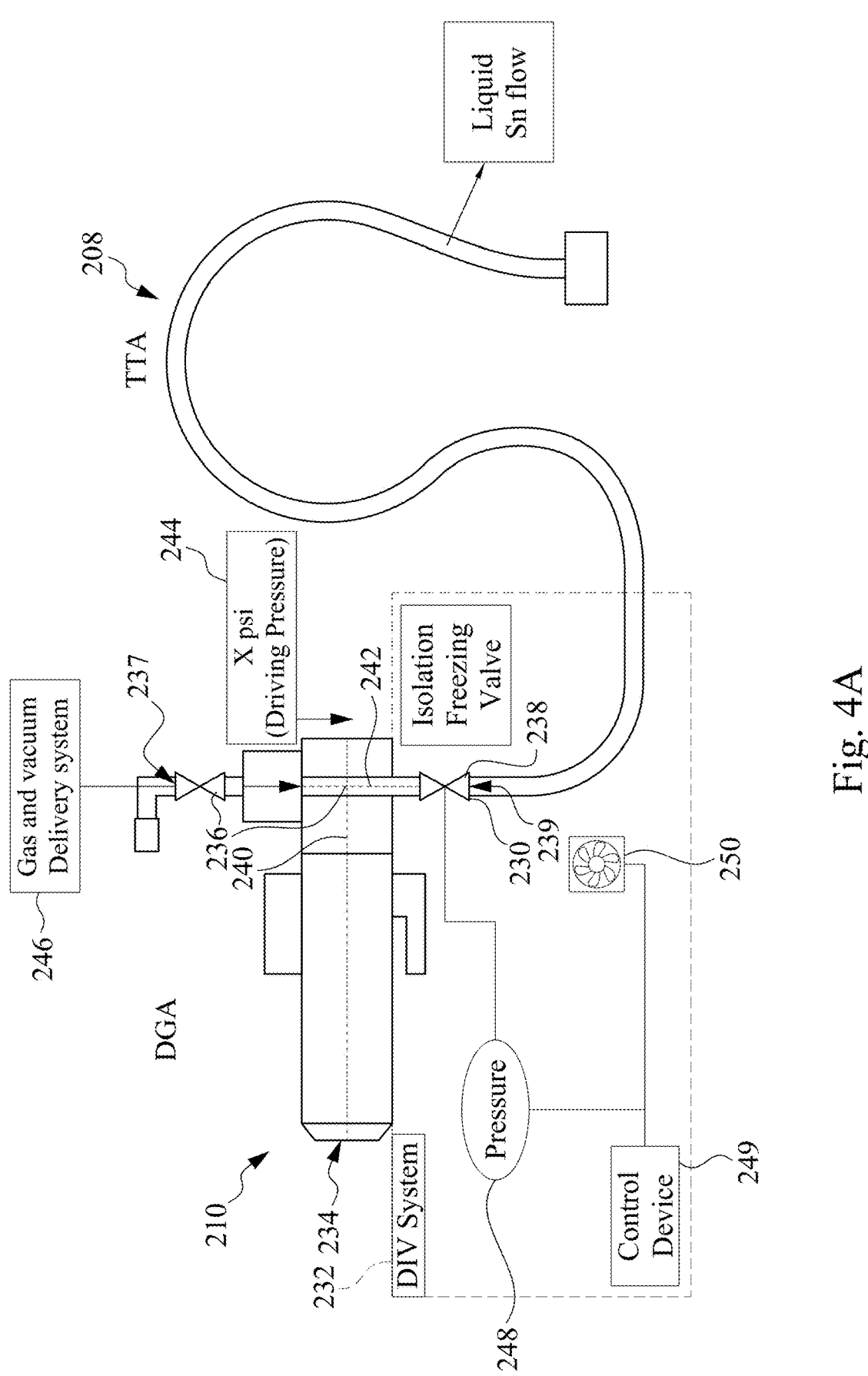
FIGS. 4A-4C are directed to an embodiment of a method of replacement utilizing the embodiment of the DIV system of the present disclosure to replace a first droplet generator of the MVDGA with a second droplet generator.
Figure 4B:
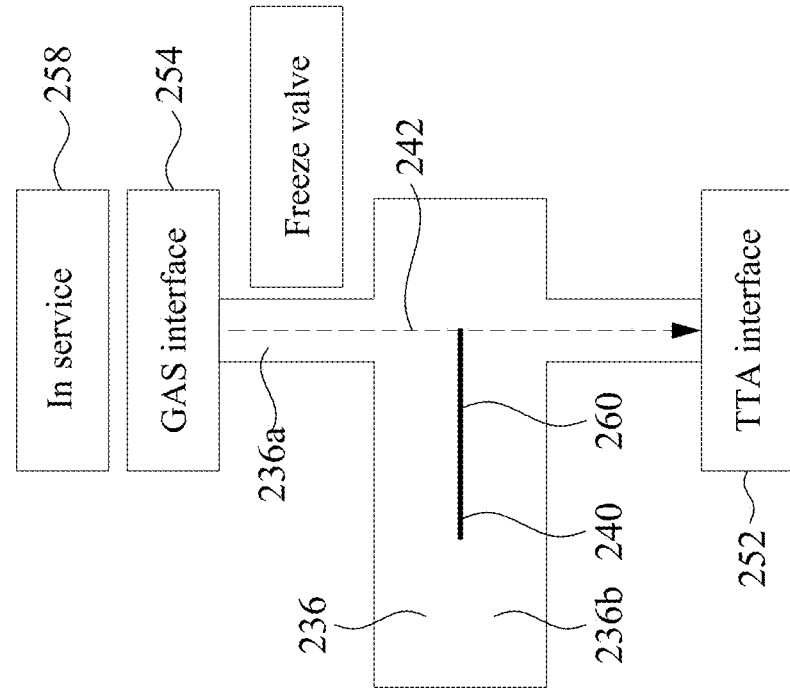
Figure 4B:
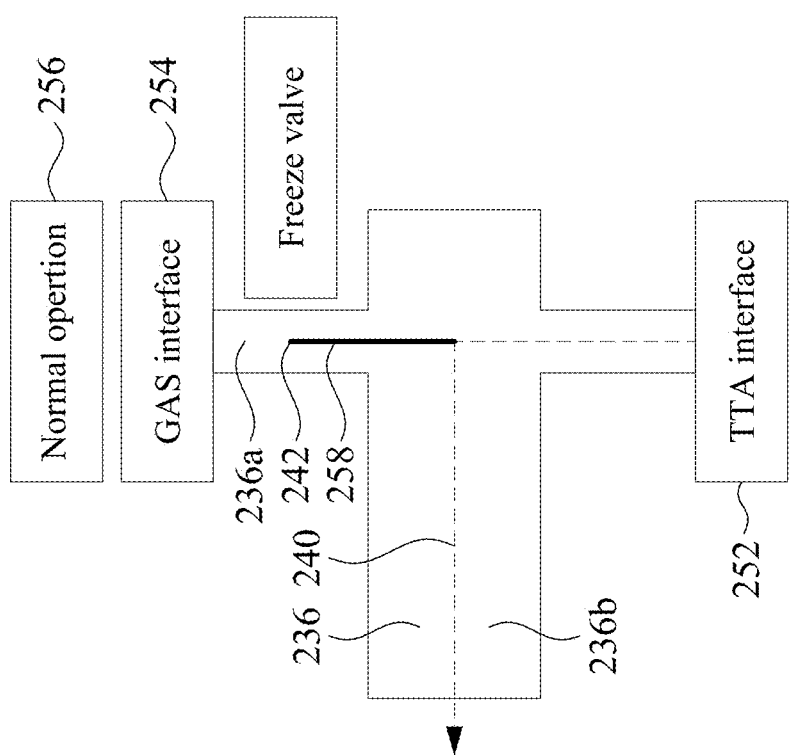
Figure 4C:
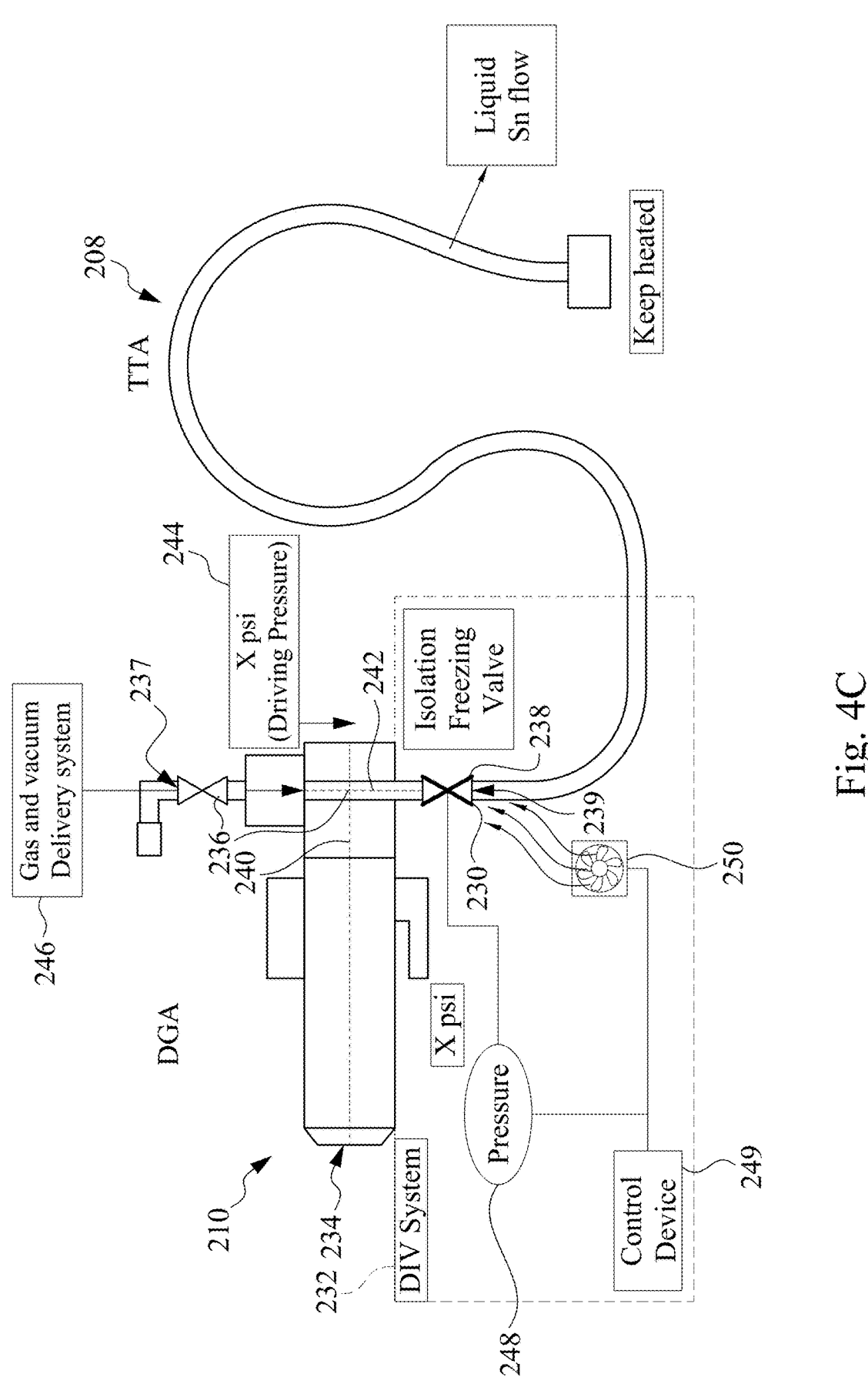

FIGS. 4A-4C are directed to a system useful in a method of replacement of the DGA 210 as shown in a flowchart 300 of FIG. 5. As discussed earlier, the DGA 210 includes the service valve 236 and the DGA isolation valve (DIV) system 232 including the isolation valve 238. In this embodiment of the DGA 210, a first orifice 237 of the service valve 236 and a second orifice 239 of the isolation valve 238 are at opposite sides of the DGA 210. The service valve 236 is positioned between and in fluid communication with an operation pathway 240 and a service pathway 242. The operation and service pathways 240, 242 extend through the DGA 210, respectively, and the operation and service pathways 240, 242 may overlap each other. The service valve 236 and the gas and vacuum delivery system may be a gas interface 254, which is readily seen in FIG. 4B. The operation and service pathways 240, 242, respectively, are the same or similar to the operation and service pathways 116, 120, respectively, of the DGA 100 as discussed with respect to FIGS. 1 and 2.

Before the method of the flowchart 300 as shown in FIG. 5, which is discussed as follows with respect to FIGS. 4A-4C, operation of the DGA 210 is ceased before carrying out steps 302, 304, 306, 308, 310 of the flowchart 300. This ceasing operation of the DGA is represented by step 301 as shown in FIG. 5.

FIG. 4A is directed to introducing a gas 244, which is the same or similar to the gas 112 as discussed with respect to FIG. 1, from a gas and vacuum delivery assembly 246, which is the same or similar to the gas vacuum delivery assembly as discussed with respect to FIG. 1. This introduction of the gas 112, closing of the operation pathway 240, and opening of the service pathway 242 is represented by a step 302 as shown in the flowchart 300 of FIG. 5. The gas 244 is introduced from the gas and vacuum delivery assembly 246 to the DGA 210 by opening the service valve 236 along the service pathway 242. The service valve 236 may be a service freezing valve (SFV). A functionality of the service valve 236 when the service valve 236 is a service freezing valve (SFV) will be discussed later on with respect to FIG. 4B.

When the gas 244 is introduced to the DGA 210 by opening the service valve 236 along the service pathway 242, the gas 244 passes through the DGA 210 along the service pathway 242, which extends from the service valve 236 to the isolation valve 238. The gas 244 is introduced through the service pathway 242 at a selected pressure (X psi). In at least one embodiment, the selected pressure is substantially equal to 26 psi. The gas 244 drives (e.g., pushes or moves a gas-liquid interface) the liquid fuel 211 in the service pathway 242 to the isolation valve 238 such that the liquid fuel 211 is no longer present within the service pathway 242 and exits the DGA 210 entering the isolation valve 238. At least some of the liquid fuel 211 may be driven through the second orifice 239 of the isolation valve 238 into the second end 230 of the TTA 208 such that the liquid fuel 211 exits the isolation valve 238 and enters the TTA 208.

At substantially the same time or some time before the gas 244 is introduced to the service pathway 242, the operation pathway 240 extending through the DGA 210 from the nozzle 234 to the isolation valve 238 is closed by closing the service valve 236 along the operation pathway 240. Closing the operation valve utilizing the service valve 236 causes the gas 244 to not enter the operation pathway 240.

In view of the above discussion, the gas 244 is directed along the service pathway 242 by closing the service valve 236 along the operation pathway 240 and opening the service valve 236 along the service pathway 242 such that the gas 244 passes through the service pathway 242 from the service valve 236 to the isolation valve 238 driving the liquid fuel 211 through the DGA 210 to the isolation valve 238. In other words, the service valve 236 isolates the gas 244 from the operation pathway 240 and introduces the gas 244 to the service pathway 242.

During the above process, the gas 244 is continually introduced through the service valve 236 into the service pathway 242 until a pressure of (e.g., at, within, around, adjacent to the isolation valve, etc.) the isolation valve 238 is substantially equal to or greater than a selected or predetermined threshold pressure. The pressure of the isolation valve 238 may be a pressure within the isolation valve 238, a pressure at or near a first end of the isolation valve 238 closer to the DGA 210, a pressure at or near a second end of the isolation valve opposite to the first end, a pressure around the isolation valve 238, or a pressure adjacent to the isolation valve 238. The second end of the isolation valve 238 being further away from the DGA 210 relative to the first end. For example, the first end of the isolation valve may be in direct fluid communication with the DGA 210, and the second end may be in direct fluid communication with the TTA 208. Based on the orientation as shown in FIG. 4A, the first end of the isolation valve 238 is a top end and the second end of the isolation valve 238 is a bottom end. The selected threshold pressure may be substantially equal to the pressure (X psi) of the gas 244 that is being introduced into the service valve 236 entering the service pathway 242. In at least one embodiment, the selected threshold pressure is substantially equal to 26 psi.

The DIV system 232 further includes a pressure sensor 248 coupled to the isolation valve 238. The pressure sensor 248 monitors the pressure of (e.g., at, within, around, or adjacent to the isolation valve, etc.) the isolation valve 238. The pressure sensor 248 is coupled to a control device 249 such as a computer or some other type of control device, and the pressure sensor 248 provides a pressure signal representative of the pressure of (e.g., at, within, around, adjacent to the isolation valve, etc.) the isolation valve 238. For example, the pressure signal may send the pressure signal to the control device 249, the control device then compares the pressure signal to a selected pressure threshold. When the control device determines the pressure of (e.g., at, within, around, adjacent to the isolation valve, etc.) the isolation valve 238 is substantially equal to or greater than the selected threshold pressure, the control device outputs a control signal to a temperature adjustment module 250 of the DIV system 232 that begins operation (e.g., turn on) of the temperature adjustment module 250 decreasing a temperature of the isolation valve 238. This beginning operation of the temperature adjustment module 249 to close the isolation valve 238 is represented by a step 304 as shown in the flowchart 300 of FIG. 5. The temperature adjustment module 250 may be a cooling element such as a cooling fan.

Alternatively, if the control device determines that the pressure of (e.g., at, within, around, adjacent to the isolation valve, etc.) the isolation valve 238 is less than the selected threshold pressure, the control device does not output a control signal such that gas remains being continuously introduced through the service valve 236.

FIG. 4C is directed to the temperature adjustment module 250 being turned on when the pressure of (e.g., at, within, around, or adjacent to the isolation valve, etc.) the isolation valve 238 is substantially equal to or greater than the selected threshold pressure. When the pressure is substantially equal to or greater than the selected threshold pressure, substantially any of the liquid fuel 211 previously present within the DGA 210 along the service pathway 242 is no longer present within the service pathway 242 as the liquid fuel 211 has been driven back to the isolation valve 238 or past the isolation valve 238 into the TTA 208. Through a TTA interface 252 between the TTA 208 and the isolation valve 238. The TTA 208 interface may readily be seen in FIG. 4B.

By way of example, when the temperature adjustment module 250 is the cooling fan and is turned on to decrease the temperature of the isolation valve 238, the cooling fan exposes the isolation valve 238 to cold air decreasing the temperature of the isolation valve 238. When the temperature of the isolation valve 238 is decreased enough, the liquid fuel 211 present in the isolation valve 238 solidifies closing the isolation valve 238. In other words, the temperature of the isolation valve 238 is decreased enough such that the liquid fuel 211 is at a temperature that is substantially equal to or less than a freezing point temperature of the liquid fuel 211, resulting in the liquid fuel 211 freezing and undergoing a phase change from a liquid phase to a solid phase. For example, a solidified fuel portion formed from the liquid fuel 211 plugs the isolation valve 238 such that the DGA 210 is isolated from the liquid fuel 211. By way of example and as discussed earlier, the liquid fuel 211 may be a liquid tin material having a freezing point substantially equal to substantially equal to 449.5 degrees Fahrenheit (° F.).

When decreasing the temperature of the isolation valve 238 utilizing the temperature adjustment module 250 closing the isolation valve 238, the TTA 208 remains heated such that the liquid fuel 211 in the TTA 208 remains in a liquid phase (e.g., molten) such that the liquid does not solidify within the TTA 208. As will become readily apparent in view of the further discussion, the liquid fuel 211 (e.g., molten) that is still warm within the TTA 208 may be utilized to melt a solidified fuel portion within the isolation valve 238 closing (e.g., closing off, blocking off, plugging, etc.) the isolation valve 238.

After the DGA 210 has been isolated from the liquid fuel 211 by closing the isolation valve 238, the DGA 210 may be removed, replaced, repaired, or routine maintenance may then be conducted. This removal of the DGA 210, replacement of the DGA 210, repair of the DGA 210, or routine maintenance on the DGA 210 is represented by a step 306 as shown in the flowchart 300 of FIG. 5. In some embodiments, after the isolation valve 238 has been cooled by the temperature adjustment module 250 for a selected period of time, the control device 249, which may be in electrical communication with the service valve 237, may send a control signal to close the service valve 237 terminating the introduction of the gas 112. In some other embodiments, a temperature sensor may monitor the temperature of the isolation valve 250 such that when the temperature of the isolation valve 250 is substantially equal to or less than a selected temperature threshold, the control device 249 may send a control signal to close the service valve 237.

When the DGA 210 is being replaced, the DGA 210 is removed by decoupling the DGA 210 from the isolation valve 238 and coupling a replacement DGA (not shown) to the isolation valve 238. During this replacement of the DGA 210 with the replacement DGA, the isolation valve 238 remains closed. For example, the temperature adjustment module 250 may continuously run while replacing the DGA 210 with the replacement DGA such that the isolation valve 238 does not open during the replacement process.

After the DGA 210 is replaced, repaired, or upon the completion of routine maintenance, the operation of the temperature adjustment module 250 is ceased (e.g., the temperature adjustment module 250 is turned off), the isolation valve 238 is opened, the service pathway 242 is closed, and the operation pathway 240 is opened to introduce the liquid fuel 211 to the DGA 210 or the replacement DGA. This ceasing of the temperature adjustment module 250, the opening of the isolation valve 238, the closing of the service pathway 242, and the opening of the operation pathway 240 to introduce the liquid fuel 211 is represented by a step 308 as shown in the flowchart 300 of FIG. 5.

By ceasing operation of the temperature adjustment module 250, the temperature of the isolation valve 238 increases by heat from the liquid fuel 211 in the TTA 208 directly adjacent to the solidified fuel portion previously plugging the isolation valve 238. A phase change of the solidified fuel portion from a solid phase to a liquid phase opens the isolation valve 238 such that the liquid fuel 211 passes through the isolation valve 238 into the DGA 210 or the replacement DGA.

In an alternative embodiment, the temperature adjustment module 250 the DIV system 232 may be a combination of a heating module and a cooling module such as a heating fan that is separate and distinct from the cooling fan to increase the speed at which the solidified fuel portion undergoes a phase change from a solid phase to a liquid phase. In yet another alternative embodiment, the temperature adjustment module 250 of the DIV system 232 may include both a cooling and heating module that are integrated with each other in a single component, which may perform the operations of both the heating module and the cooling module as discussed above.

At substantially the same time or before the isolation valve 238 is opened introducing the liquid fuel 211 to the replacement DGA or the DGA 210 after being repaired or having undergone routine maintenance, the service pathway 242 is closed by the service valve 236 and the operation pathway 240 is opened by the service valve 236. For example, similar to the opening and closing of the service pathway 242 and the operation pathway 240, respectively, as discussed earlier with respect to passing the gas 244 through the service valve 236, the opposite occurs in at this step. In other words, closing the service valve 236 along the service pathway 242 closes the service pathway 242, and opening the service along the operation pathway 240 opens the operation pathway 240. Closing the service pathway 242 and opening the operation pathway 240 utilizing the service valve 236, directs the liquid fuel 211 introduced to the replacement DGA or the DGA 210 to move along the operation pathway 240 to a nozzle of the replacement DGA or the nozzle 234 of the DGA 210. Once the liquid fuel 211 is introduced and reaches the nozzle of the replacement DGA or the nozzle 234 of the DGA 210, the DGA 210 may be turned on such that the replacement DGA or the DGA 210 begins to eject or discharge droplets of the liquid fuel 211 or a stream of the liquid fuel 211. As discussed earlier, the ejected or discharge liquid fuel 211 may be ejected into a vacuum chamber (not shown) and then exposed to a laser in the vacuum chamber to generate EUV light. In other words, operation of the replacement DGA or the DGA 210 is started as represented by step 310 as shown in the flowchart of FIG. 5.

FIG. 4B is directed to an operation or the functionality of the service valve 236 as discussed above with respect to FIGS. 4A and 4C when the service valve 236 is a service freeze valve (SFV). While this discussion is directed to the service valve 236, it will be readily appreciated that the following discussion readily applies to an operation or a functionality of the isolation valve 238 when the isolation valve 238 is an isolation freezing valve (IFV).

Under a normal operation mode 256 as shown in the left-hand side image in FIG. 4B, the service pathway 242 is closed along a first portion 236a of the service valve 236 by a first solidified fuel portion 258 (e.g., frozen fuel) blocking or closing off the service pathway 242. The first solidified fuel portion closes or blocks (e.g., plugs) the service pathway 242 such that the liquid fuel 211 is directed along the operation pathway 240 and does not move along the service pathway 242. The liquid fuel 211 (e.g., molten fuel) moves along and passes through the operation pathway 240 along the dotted arrows as shown in the left-hand side image of FIG. 4B. As the liquid fuel 211 abuts the first solidified fuel portion when moving along the operation pathway 240, the liquid fuel 211 is directed toward the left-hand side of FIG. 4B based on the orientation of the service valve 236 in FIG. 4B. The liquid fuel 211 continues moving along the operation pathway 240 until the liquid fuel 211 reaches the nozzle 234 of the DGA 210, and the liquid fuel 211 at the nozzle 234 is ejected or discharged from the nozzle 234. In other words, the liquid fuel 211 passes through the operation pathway 240 from the TTA 208 interface to the nozzle 234 of the DGA 210. The normal operation mode corresponds to the operation of the DGA 210 when the DGA 210 is ejecting or discharging the liquid fuel 211 as droplets or as a stream into a vacuum chamber to generate EUV light to perform a lithography process, which was discussed in detail earlier within the present disclosure.

Under an in service operation mode 258 or a service operation mode, the first solidified fuel portion undergoes a phase change from a solid phase to a liquid phase opening the service valve 236 along the service pathway 242. The first solidified fuel portion may be melted into the liquid phase by increasing a temperature of the first portion of the service valve 236. The operation pathway 240 is closed by decreasing a temperature of a second portion 236b of the service valve 236 causing the liquid fuel 211 present in the second portion of the service valve 236 to undergo a phase change from a liquid phase to a solid phase. The phase change of the liquid fuel 211 from the liquid phase to the solid phase results in forming a second solidified fuel portion 260 in the second portion of the service valve 236 along the operation pathway 240. The second solidified fuel portion 260 closes the operation pathway 240 such that the liquid fuel 211 is directed along the service pathway 242 through the service valve 236. The second solidified fuel portion closes or blocks (e.g., plugs) the operation pathway 240 such that the liquid fuel 211 is directed along the operation pathway 240 and does not move along the service pathway 242. The liquid fuel 211 moves along the service pathway 242 as indicated by the dotted arrow in the right-hand side image in FIG. 4B. As the liquid fuel 211 moves along the service pathway 242 and abuts the second solidified fuel portion, the liquid fuel 211 is directed toward the bottom side of FIG. 4B based on the orientation of the service valve 236 in FIG. 4B. In other words, the liquid fuel 211 passes through the service pathway 242 from the gas interface between the gas and vacuum delivery to the TTA 208 interface at which the TTA 208 and the isolation valve 238 are present. The in service operation mode corresponds to the servicing (e.g., replacement of the DGA, repair of the DGA 210, or maintenance of the DGA 210) as discussed earlier with respect to FIGS. 4A and 4C.

To switch back from the in service operation mode to the normal operation mode, the temperature of the second portion of the service valve 236 is increased such that the second solidified fuel portion undergoes a phase change from a solid phase to a liquid phase (e.g., melts, thaws, etc.) opening the operation pathway 240. At substantially the same time or before forming the second solidified fuel portion, the temperature of the first portion of the service valve 236 is decreased resulting in the liquid fuel 211 in the first portion of the service valve 236 undergoing a phase change from a liquid phase to a solid phase forming the first solidified fuel portion closing the service pathway 242. After the service pathway 242 is closed and the operation pathway 240 is opened utilizing the service valve 236, the liquid fuel 211 moves along the operation pathway 240 to the nozzle of the replacement DGA or the nozzle 234 of the DGA 210 to be ejected or discharged from the nozzle of the replacement DGA or the nozzle 234 of the DGA 210 to generate the EUV light to perform a lithography process.

As discussed earlier, the method of replacement as discussed above with respect to replacing the DGA 210 as shown in FIGS. 4A-4C with a replacement DGA utilizing the service valve 236 and the isolation valve 238 takes about substantially 30 minutes (mins) or less to complete the method of replacement. During this substantially 30-minute or less period of time, the MVDGA 98 cannot operate such that the EUV lithography system cannot perform a lithography process as the EUV lithography system cannot generate EUV light. This substantially 30-minute or less period of downtime is significantly less than the 4-hour to 5-hour downtime when utilizing the method of replacement as discussed with respect to FIG. 1. This significant reduction in downtime improves the efficiency of the MVDGA 200 as shown in FIG. 2 as compared to the MVDGA 98 as shown in FIG. 1 that does not include the isolation valve 238. This increases turnaround time and the amount of product that the MVDGA 200 may be utilized in processing, forming, or refining when performing an EUV lithography process to produce extremely small features in substrates such as silicon wafers.

A method may be summarized as including operating a first droplet generator of an extreme ultra-violet (EUV) lithography system to form droplets of a liquid fuel from a liquid fuel supply in fluid communication with the first droplet generator. Stopping operation of the first droplet generator. Isolating the liquid fuel from the first droplet generator, the isolating the liquid fuel from the first droplet generator including introducing a gas at a first pressure from a gas supply through a service valve in fluid communication with the first droplet generator, a gas-liquid interface forming between the gas and the liquid fuel in the first droplet generator. While introducing the gas, driving the gas-liquid interface to an isolation valve in fluid communication with the first droplet generator. Determining if the liquid fuel is isolated from the first droplet generator by detecting a second pressure of the isolation valve. Closing the isolation valve when the second pressure is substantially equal to or greater than a threshold pressure. After the isolation valve is closed, removing the first droplet generator from the EUV lithography system and, once the first droplet generator is removed, coupling a second droplet generator to the EUV lithography system. In an alternative method, the first droplet generator may be repaired or maintained instead of being replaced by the second droplet generator.

A system may be summarized as including a droplet generator assembly. A service valve coupled to the droplet generator assembly. An isolation valve coupled to the droplet generator assembly and in fluid communication with the service valve. A pressure sensor coupled to the isolation valve. A temperature adjustment module coupled to the pressure sensor.

A method may be summarized as including isolating a first droplet generator of an extreme ultra-violet (EUV) lithography system from a liquid fuel supply assembly, the isolating of the first droplet generator including opening an isolation valve at an end of the liquid fuel supply assembly. The isolation valve between the liquid fuel supply assembly and the first droplet generator and in fluid communication with the first droplet generator. After opening the isolation valve, driving a liquid fuel from the first droplet generator through the isolation valve and driving a gas-liquid interface between a gas and the liquid fuel to the isolation valve. Once the gas-liquid interface is driven to the isolation valve, isolating the liquid fuel from the first droplet generator by closing the isolation valve.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A system, comprising:
a droplet generator assembly;
a service valve coupled to the droplet generator assembly;

an isolation valve coupled to the droplet generator assembly and in fluid communication with the service valve;

a pressure sensor coupled to the isolation valve, the pressure sensor is configured to, in operation, monitor a pressure of the isolation valve;

a temperature adjustment module configured to, in operation, adjust a temperature of the isolation valve; and a controller configured to, in operation, cause the temperature adjustment module to adjust the temperature of the isolation valve when the pressure of the isolation valve is at least at a threshold pressure.

2. The system of claim 1, further comprising a gas and vacuum delivery assembly coupled to the service valve.

3. The system of claim 2, wherein, when the service valve is in an opened position, the gas and vacuum delivery assembly is in fluid communication with the droplet generator assembly and the isolation valve.

4. The system of claim 1, wherein, when the service valve is in a closed position, the gas and vacuum delivery assembly a fluid is prevented from being introduced into the droplet generator assembly and the isolation valve.

5. The system of claim 4, wherein the service valve is a service freeze valve configured to, in operation, form a solidified fuel plug to close the service valve to prevent the gas from the gas and vacuum service system from being introduced into the droplet generator assembly.

6. The system of claim 1, wherein the service valve is a service freeze valve, configured to, in operation, form a solidified fuel plug to close the service valve.

7. A system, comprising:

a droplet generator assembly;

a service valve coupled to the droplet generator assembly and coupled to a gas vacuum delivery system, and wherein, when the service valve is in an opened position, a gas is introduced into the droplet generator assembly, and, when the service valve is in a closed position, the gas is prevented from being introduced into the droplet generator assembly;

an isolation valve coupled to the droplet generator assembly and in fluid communication with the service valve through the droplet generator assembly, and the isolation valve in fluid communication with a liquid fuel transfer assembly;

a pressure sensor coupled to the isolation valve, the pressure sensor is configured to, in operation, measure a pressure within the isolation valve and output a signal;

a control device coupled to the pressure sensor, the control device is configured to, in operation, receive the signal output by the pressure sensor;

a temperature adjustment module coupled to the control device, and the temperature adjustment module is configured to, in operation, reduce a temperature of the isolation valve.

8. The system of claim 7, wherein the gas and vacuum delivery system is configured to, in operation, drive a gas through the service valve and into the droplet generator assembly to drive a gas-liquid interface between the gas and a liquid fuel to the isolation valve.

9. The system of claim 7, wherein the control device is configured to, in operation, receive the signal output by the pressure sensor, analyze the signal output by the pressure sensor to determine whether the pressure within the isolation valve is greater than a threshold pressure, and, when the pressure within the isolation valve is greater than the threshold pressure, activate the temperature adjustment module to reduce the temperature of the isolation valve.

10. The system of claim 7, wherein the droplet generator assembly includes a nozzle configured to, in operation, eject a liquid fuel provided through the liquid fuel transfer assembly to the droplet generator assembly.

11. The system of claim 10, further comprising:

an operation pathway for the liquid fuel that extends from the isolation valve to the nozzle of the droplet generator assembly; and a service pathway for the liquid fuel that extends from the service valve to the isolation valve through the droplet generator assembly.

12. The system of claim 11, wherein the service valve is a service freeze valve configured to, in operation, form a solidified fuel plug to close the service valve to prevent gas from the gas and vacuum service system from entering the droplet generator assembly.

13. The system of claim 11, wherein, when the temperature adjustment module is activated to reduce a temperature of the isolation valve, a solidified fuel plug is formed in the isolation valve to prevent the liquid fuel from being introduced from the liquid fuel transfer assembly and into the droplet generator assembly.

14. The system of claim 7, further comprising:

a liquid fuel storage or supply assembly coupled to the liquid fuel transfer assembly;

a liquid refill assembly coupled to the liquid fuel storage or supply assembly; and a refill and priming assembly coupled to the liquid refill assembly.

15. A system, comprising:

a droplet generator assembly having a first side and a second side opposite the first side;

a service valve with a first orifice at the first side of the droplet generator assembly;

an isolation valve with a second orifice at a second side of the droplet generator assembly;

a temperature adjustment module in proximity to the isolation valve and configured to, in operation, reduce a temperature of the isolation valve;

a nozzle at an end of the droplet generator assembly, the nozzle in fluid communication with the service valve and the isolation valve through the droplet generator assembly;

a service pathway extends through the droplet generator assembly and extends from the first orifice of the service valve to the second orifice of the isolation valve;

an operation pathway extends through the droplet generator assembly and extends from the second orifice of the isolation valve to the nozzle at the end of the droplet generator assembly;

a liquid fuel transfer assembly in fluid communication with the isolation valve, the liquid fuel transfer assembly is configured to, in operation, introduce a liquid fuel into the droplet generator assembly through the second orifice of the isolation valve.

16. The system of claim 15, further comprising introducing a gas from a gas and vacuum service system into the droplet generator assembly through the first orifice of the service valve.

17. The system of claim 15, further comprising:

a liquid fuel storage or supply assembly coupled to the liquid fuel transfer assembly;

a liquid refill assembly coupled to the liquid fuel storage or supply assembly; and a refill and priming assembly coupled to the liquid refill assembly.

18. The system of claim 15, further comprising:

a pressure sensor coupled to the isolation valve; and a control device coupled to the pressure sensor.

19. The system of claim 18, wherein:

the pressure sensor is configured to, in operation, measure a pressure within an isolation valve and output a signal to the control device; and the control device is configured to, in operation, receive the signal output by the pressure sensor, analyze the signal output by the pressure sensor to determine whether the pressure within the isolation valve is equal to or greater than a threshold pressure, and, when the pressure within the isolation valve is equal to or greater than the threshold pressure, activate the temperature adjustment module to reduce the temperature of the isolation valve.

20. The system of claim 15, wherein:

the service valve is a freezing service valve configured to, in operation, form a first solidified fuel plug within the service valve to close the service valve; and reducing the temperature of the isolation valve with the temperature adjustment valve results in forming a second solidified fuel plug within the isolation valve to close the isolation valve.

\* \* \* \* \*